United States Patent
Higgins, III et al.

(10) Patent No.: US 10,249,557 B2
(45) Date of Patent: Apr. 2, 2019

(54) PACKAGED INTEGRATED CIRCUIT DEVICE AND METHODS

(71) Applicant: NXP USA, Inc., Austin, TX (US)

(72) Inventors: Leo M. Higgins, III, Austin, TX (US); Burton Jesse Carpenter, Austin, TX (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/602,974

(22) Filed: May 23, 2017

(65) Prior Publication Data

US 2018/0342444 A1 Nov. 29, 2018

(51) Int. Cl.
*H01L 23/62* (2006.01)
*H01L 23/495* (2006.01)

(52) U.S. Cl.
CPC .. *H01L 23/49551* (2013.01); *H01L 23/49503* (2013.01); *H01L 23/49541* (2013.01); *H01L 23/49558* (2013.01)

(58) Field of Classification Search
CPC .............. H01L 23/49503; H01L 23/49558
See application file for complete search history.

(56) References Cited

U.S. PATENT DOCUMENTS

| | | | |
|---|---|---|---|
| 6,137,159 A | 10/2000 | Tsubosaki et al. | |
| 6,362,517 B1 | 3/2002 | Bell et al. | |
| 6,667,547 B2 | 12/2003 | Woodworth et al. | |
| 2004/0232541 A1 | 11/2004 | Son et al. | |
| 2014/0124912 A1 | 5/2014 | Kaneda | |

FOREIGN PATENT DOCUMENTS

EP 2889904 A1 7/2015

OTHER PUBLICATIONS

NVE Corporation, "Application Bulletin AB-23, NVE Isolators Feature TRUE Eight Millimeter Creepage," ISB-AP-23; rev. Mar. 2013, 2 pages.
Analog Devices, "Creepage Requirements for Medical Applications," 2011 Analog Devices, Inc., T10173-0-9/11, analog.com, 2 pages.
Liu, Yong, "Chapter 2, Power Package Electrical Isolation Design," 2012, XVIII, Power Electronic Packaging Design, Assembly Process, Reliability and Modeling, Springer Science & Business Media, Chapter 2, ISBN: 978-1-4614-1052-2, www.springer.com/978-1-4614-1052-2, 19 pages.
Infineon Technologies, "Product Brief: CoolSET F2 Expands Its Family," Published by Infineon Technologies AG 2002, ICExxxxx series, www.infineon.com, 2 pages.

*Primary Examiner* — Samuel A Gebremariam

(57) ABSTRACT

A packaged lead frame includes a encapsulant having a first minor side, a second minor side opposite the first minor side, a third minor side, and a fourth minor side opposite the third minor side, and a plurality of leads along the third minor side between the first minor side and a center plane between the first and second minor side. The plurality of leads extend outwardly from the encapsulant at a first plane. Each of the plurality of leads includes a corresponding jog external to the encapsulant which jogs away from the center plane, wherein the corresponding jog of each lead from a first lead of the plurality of leads closest to the center plane to a last lead of the first plurality of leads closest to the first minor side jogs incrementally further away the center plane.

20 Claims, 3 Drawing Sheets

PACKAGED INTEGRATED CIRCUIT DEVICE AND METHODS

BACKGROUND

Field

This disclosure relates generally to packaged integrated circuit devices, and more specifically, to packaged integrated circuit devices optimized for creepage distance.

Related Art

In packaged semiconductor devices, creepage distance is defined as the shortest distance between two conductive parts, along the surface of a separating insulator, minus the length of any conductive elements in the path that are isolated from the two conductive parts. FIG. 3 illustrates an embodiment of a lead frame 300 that can be used in a packaged semiconductor device known in the prior art. Lead frame includes a central die attach area 302, retention bars 304 connected to opposing sides of die attach area 302 that extend to a perimeter where encapsulant (indicated by dashed line 312) will be formed to package the semiconductor device with lead frame 300. The perimeter of the encapsulant is larger than the perimeter of die attach area 302 so leads 308, 310 include an angled portion close to die attach area 302 to allow leads 308, 310 to fan out in the encapsulant. A first series of leads 308 are positioned around a first half of die attach area 302 and are angled to extend past a first of four sides of the encapsulant perimeter 312. A second series of leads 310 are positioned around a second half of die attach area 302 and extend past a second of the four sides of the encapsulant perimeter 312 that is opposite the first side of the encapsulant perimeter 312.

As an example of an issue that can arise with creepage distance, assume leads 310 are used for high voltage signals and leads 308 are used for low voltage signals. In the JEDEC JESD4 (11/83) standard specification for packaged semiconductor devices, creepage distance between low voltage and high voltage leads is required to be greater than or equal to a specified distance, such as, for example, 8.000 millimeters (mm), on the outside surface of the package to assure high voltage isolation. Creepage distance for lead frame 300 is the distance between leads 308 and 310 minus the L1 and L2 portions of retention bar 304 that are exposed through the encapsulant. This requirement has not been possible to meet using standard lead frame and package designs when the worst case dimensional conditions are assumed. For example, in lead frame 300, the creepage distance under the worst case dimensional conditions (maximum lead width, maximum lead frame tin plating thickness, minimum molded body length, etc.) could only meet a creepage distance of approximately 7.82 mm, while the creepage distance under nominal and best case dimensional conditions exceeded 8.000 mm. It is not only desirable but required to meet the creepage requirements even under worst case dimensional conditions.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Embodiments of packaged lead frames disclosed herein include progressively increasing offsets or jogs in an intermediate segment of the leads to cause an increase in the creepage distance around the end of the package. In addition, creepage distance is increased by reducing the cross-section of metal features such as retention bars exposed through the encapsulant along the path between high and low voltage leads.

Figure 1:
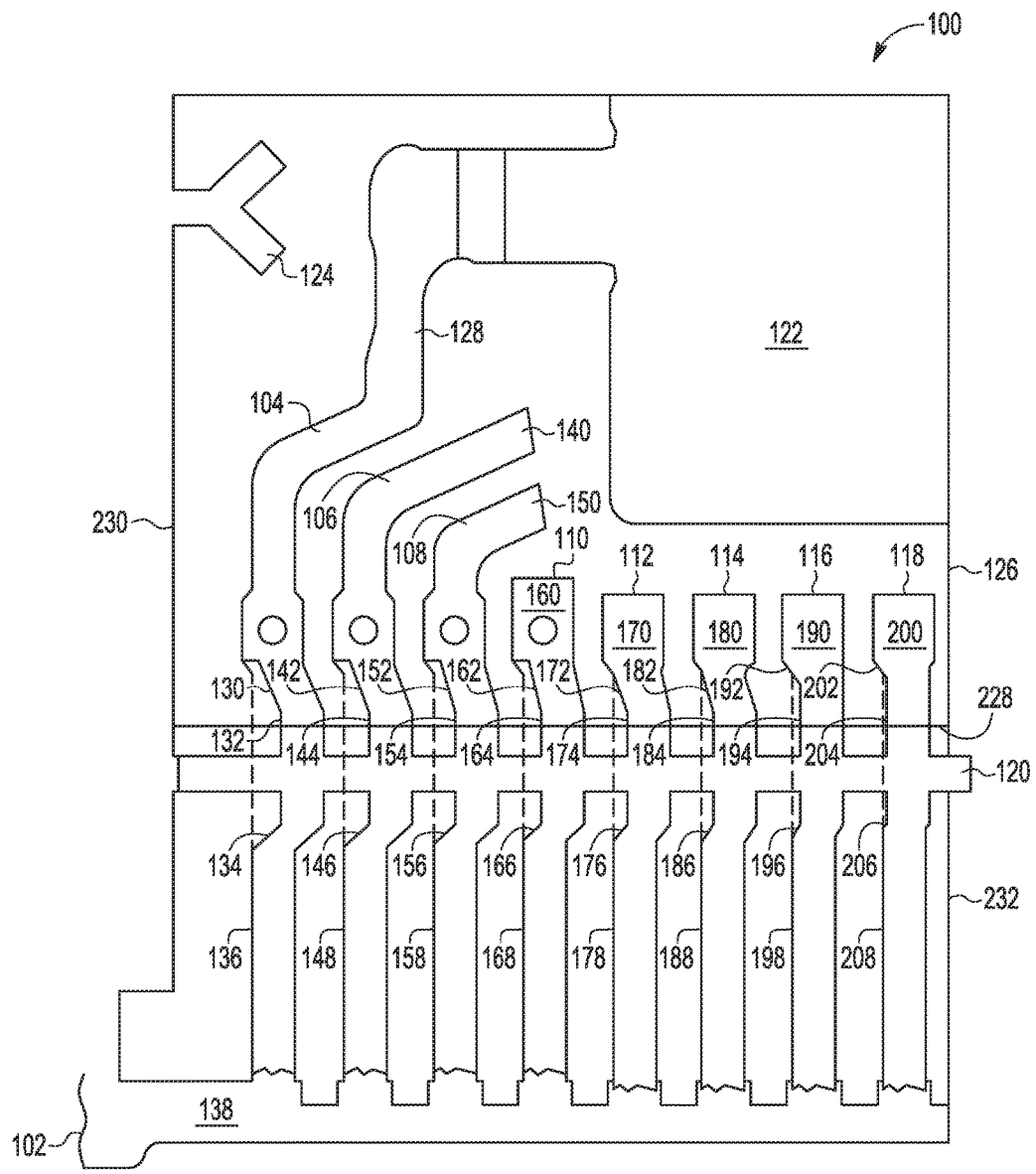
FIG. 1 illustrates a top view of a portion of an embodiment of a packaged semiconductor device in accordance with the present invention.
Figure 3:
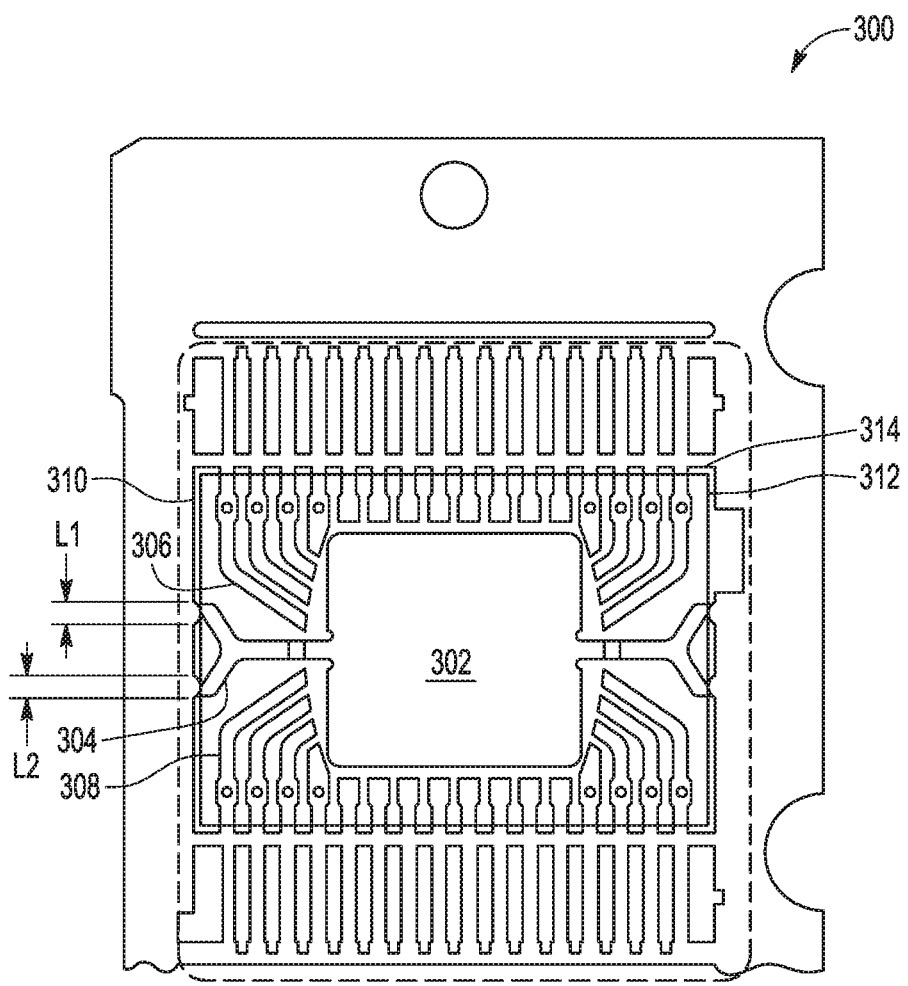
FIG. 3 illustrates an embodiment of a lead frame that can be used in a packaged semiconductor device in accordance with the prior art.

FIG. 1 illustrates a top view of a portion of an embodiment of a packaged semiconductor device 100 in accordance with the present invention that includes lead frame 102 with leads 104, 106, 108, 110, 112, 114, 116 and 118 (collectively "leads 104-118"), dam bars 120, die flag or die flag or attach area 122, retention bar 124, encapsulant 126 and tie bar 138. Leads 104-118 can include one or more layers of electrically conductive material. Wire bonds (not shown) can be formed to connect each bond pad or bond region 128, 140, 150, 160, 170, 180, 190, 200 (collectively "bond regions 128-200") on respective leads 104-118 to a corresponding bond pad or bond region on an integrated circuit device (not shown) that can be mounted on die attach area 122. Although only one quadrant of packaged semiconductor device 100 is shown, semiconductor device 200 can include three more quadrants with additional leads similar to leads 104-118, such as shown for example in lead frame 300 of FIG. 3. Encapsulant 126 can include four minor sides or edges, with two edges 228, 230 being shown in FIG. 1. Die attach area 122 is connected to tie bar 120 by two leads, one of which is shown as lead 104.

Leads 104-108 include a first end with bond regions 128-200 adjacent to die attach area 122, an intermediate portion between the first end that extends respective leads 104-108 in a direction toward edge 230 of encapsulant 126, and a first jog that angles the remaining portion of leads 104-108 toward edge 228 of the perimeter of encapsulant 126. Edge 230 of the perimeter of encapsulant 126 is adjacent and perpendicular to edge 228 of encapsulant 126.

Adjacent bond regions 128-200, each of leads 104-118 includes a respective second jog 130, 142, 152, 162, 172, 182, 192, 202 (collectively, "jogs 130-202") that angles a section of leads 104-118 away from edge 230 of encapsulant 126 toward center plane 232 of edge 228. Each of jogs 130-202 incrementally increases the distance of the jogged portion of a respective lead 104-118 from edge 230 while leads 104-118 are still within the perimeter of encapsulant 126. Importantly, the increased distance is maintained where leads 104-118 first emerge external to encapsulant 126, thereby increasing creepage distance around edge 230 of the molded body of the package. As an example of the incremental increase, Table 1 below shows the incrementally increasing shifts in each of leads 104-118 due to jogs 130-202, with lead 104 closest to edge 230 having the largest shift. Note that the overall distance between leads 104-118 remains the same or greater than the distance between leads without jogs 130-202.

TABLE 1

Incremental Shifts in Leads 104-118

| Lead | Shift (micrometers) |
|---|---|
| 118 | 27 |
| 116 | 54 |
| 114 | 81 |
| 112 | 108 |
| 110 | 135 |
| 108 | 162 |
| 106 | 189 |
| 104 | 216 |

Regarding the remaining portion of leads 104-118, jogs 130-202 terminate into respective adjacent sections 132, 144, 154, 164, 174, 184, 194, 204 (collectively "sections 132-204") so that sections 132-204 extend perpendicular to edge 228 and parallel to edge 230 with the respective amount of shift. An intermediate portion of sections 132-204 is connected to dam bar 120. The purpose of dam bar 120 is to prevent encapsulant 126 from extending past the point where dam bar 120 is connected to leads 104-118 while encapsulant 126 is formed and will be removed between leads 104-118 during later stages of fabrication.

Sections 132-204 extend past dam bar 120 to another jog 134, 146, 156, 166, 176, 186, 196, 206 (collectively, "jogs 134-206") in each of respective leads 104-118. Jogs 134-206 angles toward edge 230 and away from center plane 232 of edge 228. Jogs 134-206 terminate at a respective adjacent section 136, 148, 158, 168, 178, 188, 198, 208 of leads 104-118 that extends perpendicular to edge 228 and terminates at tie bar 138 that runs parallel to edge 228.

The width of leads 104-118 can be constant, however some sections, such as bond region 160-200, can be wider than the rest of leads 104-118. In addition, once tie bar 138 is cut away during subsequent fabrication, the portion of leads 104-118 external to encapsulant 126 can bend downward away from the top surface of encapsulant 126 so that leads 104-118 extend to or below the bottom surface of encapsulant 126. The external end portion of leads can have a second bend that creates a foot to facilitate attaching packaged semiconductor device 100 to another surface, such as a printed circuit board.

In addition to the increase in creepage distance due to jogs 130-202 and 134-206, creepage distance can be further increased by configuring retention bar 124 with a Y-shape in which the end of only one segment 124 is exposed through edge 230 of encapsulant 126, while the upper segments of the Y-shape are retained in encapsulant 126. In contrast, retention bar 304 of FIG. 3 as known in the prior art, is connected to die attach area 302 and includes two segments with ends exposed at the perimeter of encapsulant 312, which decreases creepage distance compared to retention bar 124.

Figure 2:
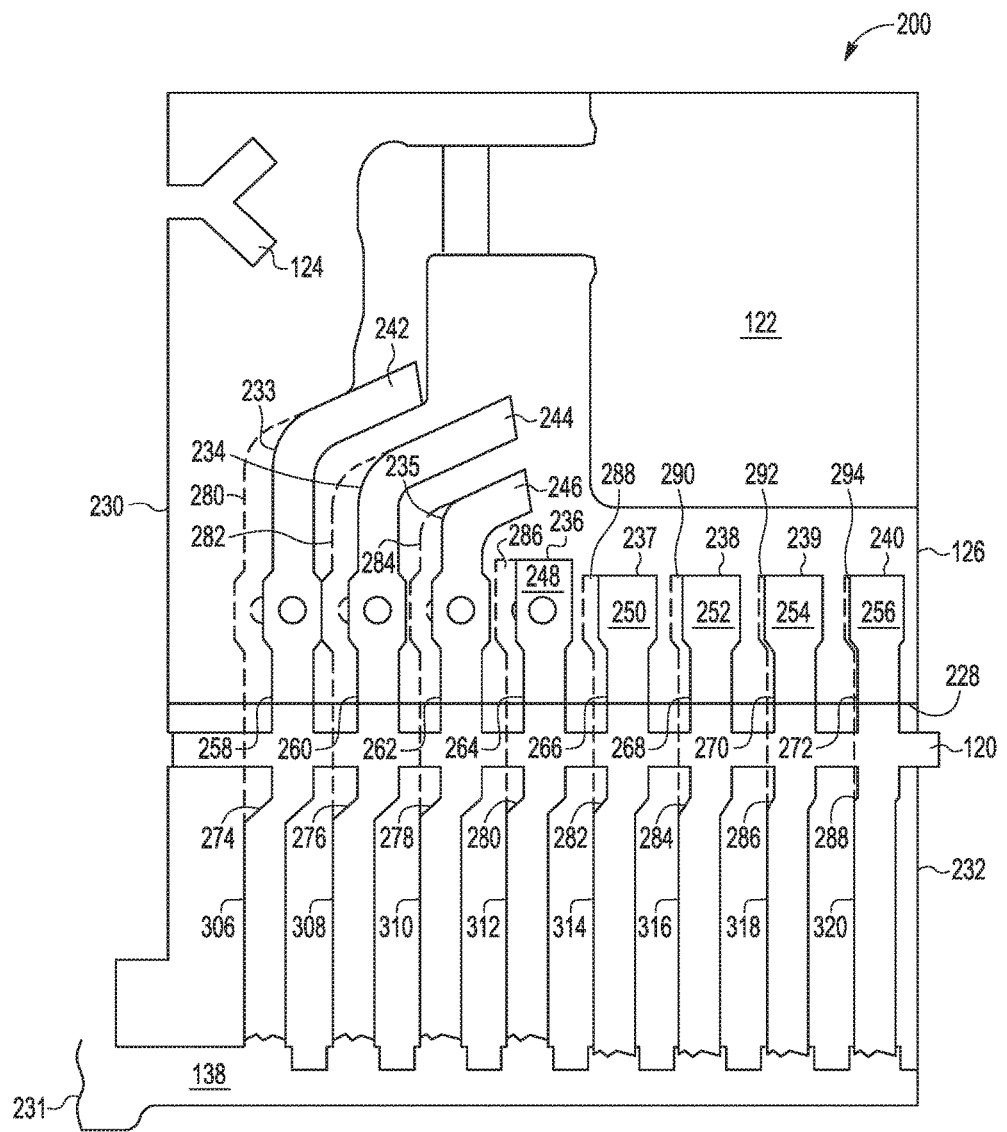
FIG. 2 illustrates a portion of another embodiment of a packaged semiconductor device in accordance with the present invention.

FIG. 2 illustrates a portion of another embodiment of a packaged semiconductor device 200 in accordance with the present invention that includes lead frame 231 with leads 233, 234, 235, 236, 237, 238, 239 and 240 (collectively "leads 233-240"), dam bar 120, die flag or die attach area 122, retention bar 124, encapsulant 126, and tie bar 138. Leads 233-240 can include one or more layers of electrically conductive material. Wire bonds (not shown) can be formed to connect each bond region 242, 244, 246, 248, 250, 252, 254, 256 (collectively "bond regions 242-256") on leads 233-240 to a corresponding bond region on an integrated circuit device (not shown) that can be mounted on die attach area 122. Although only one quadrant of packaged semiconductor device 200 is shown, lead frame 201 will include three more quadrants with additional leads similar to leads 233-240, such as shown for example in lead frame 300 of FIG. 3.

Leads 233-235 include a first end adjacent to die attach area 122, an intermediate portion adjacent the first end that extends respective leads 233-235 in a direction toward edge 230 of encapsulant 126, and a first jog that angles the remaining portion of leads 233-235 toward edge 228 of the perimeter of encapsulant 126. Edge 230 of the perimeter of encapsulant 126 is adjacent and perpendicular to edge 228 of encapsulant 126. Within the perimeter of encapsulant 126, the end of respective leads 233-240 closest to the die attach area 122 includes a respective bond region 242-256. Bond regions 242-256 are on.

Each of leads 233-240 include respective intermediate portion 258, 260, 262, 264, 266, 268, 270, 272 (collectively, "intermediate portions 258-272") that extends from respective bond region 242-256 past dam bar 120 to respective jog 274, 276, 278, 280, 282, 284, 286, 288 (collectively, "jogs 274-288") in each of respective leads 233-240. Jogs 274-288 angle toward edge 230 and away from center plane 232 of edge 228. Jogs 274-288 terminate at a respective adjacent section 306, 308, 310, 312, 314, 316, 318, 320 of leads 233-240 that extends perpendicular to edge 228 and terminates at tie bar 138 that runs parallel to edge 228.

Note that a portion of leads 233-240 that is parallel to edge 230 up to jogs 274-288 is incrementally shifted toward center plane 232 of edge 228, as indicated by outlines 280, 282, 284, 286, 288, 290, 292, 294 (collectively, "outlines 280-294"). The incremental shifts are maintained where leads 233-240 first emerge external to encapsulant 126, thereby increasing distance of lead 233 from edge 230 of encapsulant 126 and thus increasing creepage distance. As an example of the incremental increase, Table 2 below shows the incrementally increasing shifts in each of leads 233-240, with lead 233 closest to edge 230 having the largest shift.

TABLE 2

Incremental Shifts in Leads 233-240

| Lead | Shift (micrometers) |
|---|---|
| 240 | 27 |
| 239 | 54 |
| 238 | 81 |
| 237 | 235 |
| 236 | 135 |
| 235 | 162 |
| 234 | 189 |
| 233 | 216 |

The width of leads 233-240 can be constant, however some sections can have widened portions with a circular hole in them that provide mechanical locking of leads 233-240 in encapsulant 126. In addition, once tie bar 138 is removed between leads 233-240, the portion of leads 233-240 external to encapsulant 126 can bend downward away from the top surface of encapsulant 126 so that leads 233-240 extend to or below the bottom surface of encapsulant 126. The external end portion of lead can have a second bend that creates a foot to facilitate attaching packaged semiconductor device 200 to another surface, such as a circuit board.

Note that in other embodiments, some of leads 104-118 (FIG. 1) and 233-240 may be straight and not include a jog, especially close to centerline 232.

By now it should be appreciated that in some embodiments there has been provided a packaged lead frame (100, 200) that can comprise a encapsulant (126) having a first minor side, a second minor side opposite the first minor side, a third minor side between the first and second minor sides, and a fourth minor side between the first and second minor sides and opposite the third minor side. A first plurality of leads (104-118, 233-256) is along the third minor side (bottom side of 126 on FIG. 1, 2) between the first minor side and a center plane (232) that bisects the encapsulant between the first and second minor sides. The first plurality of leads extend outwardly from the encapsulant. Each lead of the first plurality of leads, includes a corresponding jog (134-206, 274-288) external to the encapsulant which jogs away from the center plane. The corresponding jog of each lead from a first lead of the plurality of leads closest to the center plane to a last lead of the first plurality of leads closest to the first minor side jogs incrementally further away from the center plane.

In another aspect, each of the plurality of leads can include a corresponding dam bar portion (120 or the remnants of 120 after punching) and a corresponding outer end portion and in each lead of the plurality of leads. The corresponding jog can be located between the corresponding outer end portion and the corresponding dam bar portion.

In another aspect, the encapsulant can have a top major surface and a bottom major surface wherein the first, second, third, and fourth minor surfaces are in between the top and bottom major surfaces. Each lead of the plurality of leads can include a first bend (not illustrated—where leads bend downwards) in which the corresponding lead bends away from the top major surface.

In another aspect, in each lead of the first plurality of leads, the corresponding jog can occur completely between the encapsulant and the corresponding bend.

In another aspect, in each lead of the plurality of leads, the corresponding jog can occur completely between the corresponding bend and a corresponding outer end of the corresponding lead.

In another aspect, in each lead of the plurality of leads, the corresponding jog can occur at least in part at the corresponding bend.

In another aspect, the each lead of the plurality of leads can include a second bend in which the corresponding lead bends towards the top major surface.

In another aspect, the plurality of leads can include at least 3 leads.

In another aspect, each lead of the plurality of leads can include a corresponding inner portion (e.g. 258) located between the encapsulant and the corresponding jog and a corresponding outer end portion (e.g. 306), and wherein the corresponding inner portion can have a same width as the corresponding outer end portion.

In another aspect, the corresponding jogs can jog incrementally further away from the center plane in uniform increments from the first lead of the plurality of leads closest to the center plane to the last lead of the plurality of leads closest to the first minor side.

In another aspect, the packaged lead frame can further comprise a second plurality of leads along the third minor side between the first minor side and the center plane and extending outwardly from the encapsulant at the first plane, wherein each of the second plurality of leads has no jog.

In another aspect, the packaged lead frame can further comprise a second plurality of leads along the third minor side between the center plane and the second minor side and extending outwardly from the encapsulant. Each of the second plurality of leads includes a second corresponding jog external to the encapsulant which jogs away from the center plane. The corresponding jog of each lead from a first lead of the second plurality of leads closest to the center plan to a last lead of the second plurality of leads closest to the second minor side jogs incrementally further away from the center plane.

In another aspect, the corresponding jogs of the plurality of leads and the corresponding jogs of the second plurality of leads jog in opposite directions from each other.

In another aspect, each lead of the plurality of leads extends into the encapsulant and includes a second corresponding jog within the encapsulant.

In other embodiments, a packaged lead frame can comprise a encapsulant having a first minor side, a second minor side opposite the first minor side, a third minor side between the first and second minor sides, and a fourth minor side between the first and second minor sides and opposite the third minor side. A first plurality of leads can be along the third minor side between the first minor side and a center plane that bisects the encapsulant between the first and second minor sides, wherein the first plurality of leads extend outwardly from the encapsulant. Each lead of the first plurality of leads can include a corresponding jog external to the encapsulant which jogs away from the center plane. The corresponding jog of each lead from a first lead of the plurality of leads closest to the center plane to a last lead of the first plurality of leads closest to the first minor side jogs incrementally further away from the center plane. A second plurality of leads can be along the fourth minor side between the first minor side and the center plane. The second plurality of leads can extend outwardly from the encapsulant in a direction opposite the first plurality of leads. Each of the second plurality of leads can include a second corresponding jog external to the encapsulant which jogs away from the center plane. The corresponding jog of each lead from a first lead of the second plurality of leads closest to the center plane to a last lead of the second plurality of leads closest to the first minor side jogs incrementally further away from the center plane.

In another aspect, the encapsulant can have a top major surface and a bottom major surface wherein the first, second, third, and fourth minor surfaces are in between the top and bottom major surfaces, and wherein each lead of the first plurality of leads and the second plurality of leads includes a first bend in which the corresponding lead bends away from the top major surface.

In another aspect, the first plurality of leads can include at least 3 leads and the second plurality of leads can include at least 3 leads.

In another aspect, each lead of the first plurality of leads and second plurality of leads can include a corresponding inner portion located between the encapsulant and the corresponding jog and a corresponding end portion. The corresponding inner portion can have a same width as the corresponding end portion.

In another aspect, for the first plurality of leads, the corresponding jog can jog incrementally further away the center plane in uniform increments from the first lead of the first plurality of leads closest to the center plane to the last lead of the first plurality of leads closest to first minor side. For the second plurality of leads, the corresponding jog can jog incrementally further away the center plane in uniform increments from the first lead of the second plurality of leads closest to the center plane to the last lead of the second plurality of leads closest to first minor side.

In still further embodiments, a packaged lead frame can comprise a encapsulant having a first minor side, a second minor side opposite the first minor side, a third minor side between the first and second minor sides, and a fourth minor side between the first and second minor sides and opposite the third minor side. A plurality of leads can be along the third minor side between the first minor side and a center plane that bisects the encapsulant between the first and second minor sides, wherein the plurality of leads extends outwardly from the encapsulant at the third minor side. Each lead of the plurality of leads can include a corresponding jog external to the encapsulant which jogs away from the center plane such that a center of the lead at the third minor side of the encapsulant is offset from the center of the lead at an end of the lead by a corresponding offset distance. The corresponding offset distances of the plurality of leads can incrementally increase from a first lead of the plurality of leads closest to the center plane to a last lead of the plurality of leads closest to the first minor side.

Because the apparatus implementing the present disclosure is, for the most part, composed of electronic components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure.

Although the disclosure has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

Although the disclosure is described herein with reference to specific embodiments, various modifications and changes can be made without departing from the scope of the present disclosure as set forth in the claims below. For example, Tables 1 and 2 show specific values of increases in creepage distance achieved with shifts in leads 104-118 and 233-240, however other configurations of lead frames 200, 300 can have other values of increased creepage distance. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A packaged lead frame comprising:
   a encapsulant having a first minor side, a second minor side opposite the first minor side, a third minor side between the first and second minor sides, and a fourth minor side between the first and second minor sides and opposite the third minor side; and
   a first plurality of leads along the third minor side between the first minor side and a center plane that bisects the encapsulant between the first and second minor sides, wherein the first plurality of leads extend from the encapsulant, and
   wherein each lead of the first plurality of leads, includes a corresponding jog external to the encapsulant which jogs away from the center plane, wherein the corresponding jog of each lead from a first lead of the plurality of leads closest to the center plane to a last lead of the first plurality of leads closest to the first minor side jogs incrementally further away from the center plane.

2. The packaged lead frame of claim 1, wherein each of the plurality of leads includes a corresponding dam bar portion and a corresponding outer end portion and in each lead of the plurality of leads, the corresponding jog is located between the corresponding outer end portion and the corresponding dam bar portion.

3. The packaged lead frame of claim 1, wherein the encapsulant has a top major surface and a bottom major surface wherein the first, second, third, and fourth minor surfaces are in between the top and bottom major surfaces, and wherein each lead of the plurality of leads includes a first bend in which the corresponding lead bends away from the top major surface.

4. The packaged lead frame of claim 3, wherein, in each lead of the first plurality of leads, the corresponding jog occurs completely between the encapsulant and the corresponding bend.

5. The packaged lead frame of claim 3, wherein, in each lead of the plurality of leads, the corresponding jog occurs completely between the corresponding bend and a corresponding outer end of the corresponding lead.

6. The packaged lead frame of claim 3, wherein, in each lead of the plurality of leads, the corresponding jog occurs at least in part at the corresponding bend.

7. The packaged lead frame of claim 3, wherein the each lead of the plurality of leads includes a second bend in which the corresponding lead bends towards the top major surface.

8. The packaged lead frame of claim 1, wherein the plurality of leads includes at least 3 leads.

9. The packaged lead frame of claim 1, wherein each lead of the plurality of leads includes a corresponding inner portion located between the encapsulant and the corresponding jog and a corresponding outer end portion, and wherein the corresponding inner portion has a same width as the corresponding outer end portion.

10. The packaged lead frame of claim 1, wherein the corresponding jogs jog incrementally further away from the center plane in uniform increments from the first lead of the plurality of leads closest to the center plane to the last lead of the plurality of leads closest to the first minor side.

11. The packaged lead frame of claim 1, further comprising a second plurality of leads along the third minor side between the first minor side and the center plane and extending outwardly from the encapsulant at the first plane, wherein each of the second plurality of leads has no jog.

12. The packaged lead frame of claim 1, further comprising:
a second plurality of leads along the third minor side between the center plane and the second minor side and extending outwardly from the encapsulant,
wherein each of the second plurality of leads includes a second corresponding jog external to the encapsulant which jogs away from the center plane, wherein the corresponding jog of each lead from a first lead of the second plurality of leads closest to the center plan to a last lead of the second plurality of leads closest to the second minor side jogs incrementally further away from the center plane.

13. The packaged lead frame of claim 12, wherein the corresponding jogs of the plurality of leads and the corresponding jogs of the second plurality of leads jog in opposite directions from each other.

14. The packaged lead frame of claim 1, wherein each lead of the plurality of leads extends into the encapsulant and includes a second corresponding jog within the encapsulant.

15. A packaged lead frame comprising:
a encapsulant having a first minor side, a second minor side opposite the first minor side, a third minor side between the first and second minor sides, and a fourth minor side between the first and second minor sides and opposite the third minor side; and
a first plurality of leads along the third minor side between the first minor side and a center plane that bisects the encapsulant between the first and second minor sides, wherein the first plurality of leads extend from the encapsulant, and
wherein each lead of the first plurality of leads, includes a corresponding jog external to the encapsulant which jogs away from the center plane, wherein the corresponding jog of each lead from a first lead of the plurality of leads closest to the center plane to a last lead of the first plurality of leads closest to the first minor side jogs incrementally further away from the center plane;
a second plurality of leads along the fourth minor side between the first minor side and the center plane, wherein the second plurality of leads extend outwardly from the encapsulant in a direction opposite the first plurality of leads,
wherein each of the second plurality of leads includes a second corresponding jog external to the encapsulant which jogs away from the center plane, wherein the corresponding jog of each lead from a first lead of the second plurality of leads closest to the center plane to a last lead of the second plurality of leads closest to the first minor side jogs incrementally further away from the center plane.

16. The packaged lead frame of claim 15, wherein the encapsulant has a top major surface and a bottom major surface wherein the first, second, third, and fourth minor surfaces are in between the top and bottom major surfaces, and wherein each lead of the first plurality of leads and the second plurality of leads includes a first bend in which the corresponding lead bends away from the top major surface.

17. The packaged lead frame of claim 15, wherein the first plurality of leads includes at least 3 leads and the second plurality of leads includes at least 3 leads.

18. The packaged lead frame of claim 15, wherein each lead of the first plurality of leads and second plurality of leads includes a corresponding inner portion located between the encapsulant and the corresponding jog and a corresponding end portion, and wherein the corresponding inner portion has a same width as the corresponding end portion.

19. The packaged lead frame of claim 15, wherein:
for the first plurality of leads, the corresponding jog jogs incrementally further away the center plane in uniform increments from the first lead of the first plurality of leads closest to the center plane to the last lead of the first plurality of leads closest to first minor side, and
for the second plurality of leads, the corresponding jog jogs incrementally further away the center plane in uniform increments from the first lead of the second plurality of leads closest to the center plane to the last lead of the second plurality of leads closest to first minor side.

20. A packaged lead frame comprising:
a encapsulant having a first minor side, a second minor side opposite the first minor side, a third minor side between the first and second minor sides, and a fourth minor side between the first and second minor sides and opposite the third minor side; and
a plurality of leads along the third minor side between the first minor side and a center plane that bisects the encapsulant between the first and second minor sides, wherein the plurality of leads extends from the encapsulant at the third minor side, and
wherein each lead of the plurality of leads includes a corresponding jog external to the encapsulant which jogs away from the center plane such that a center of the lead at the third minor side of the encapsulant is offset from the center of the lead at an end of the lead by a corresponding offset distance,
wherein the corresponding offset distances of the plurality of leads incrementally increase from a first lead of the plurality of leads closest to the center plane to a last lead of the plurality of leads closest to the first minor side.

* * * * *